US006865725B2

(12) United States Patent
Dickey et al.

(10) Patent No.: US 6,865,725 B2
(45) Date of Patent: Mar. 8, 2005

(54) METHOD AND SYSTEM FOR INTEGRATED CIRCUIT DESIGN

(75) Inventors: Carl E. Dickey, Alburg, VT (US); Donald L. Jordan, Weybridge, VT (US); Raminderpal Singh, Essex Junction, VT (US); Sue E. Strang, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/249,639

(22) Filed: Apr. 28, 2003

(65) Prior Publication Data

US 2004/0216063 A1 Oct. 28, 2004

(51) Int. Cl.$^7$ .............................................. G06F 17/50
(52) U.S. Cl. ...................... 716/7; 716/4; 716/5; 716/10
(58) Field of Search .............................. 716/7, 4, 5, 10

(56) References Cited

U.S. PATENT DOCUMENTS

| | | | | |
|---|---|---|---|---|
| 5,191,541 A | * | 3/1993 | Landman et al. ............... 716/6 |
| 5,640,327 A | | 6/1997 | Ting ........................... 364/488 |
| 5,659,717 A | | 8/1997 | Tse et al. ..................... 395/500 |
| 5,854,752 A | | 12/1998 | Agarwal ...................... 364/489 |
| 5,884,090 A | * | 3/1999 | Ramanan et al. ............. 712/13 |
| 5,929,510 A | * | 7/1999 | Geller et al. ................. 257/635 |
| 6,061,511 A | | 5/2000 | Marantz et al. ......... 395/500.49 |
| 6,223,329 B1 | | 4/2001 | Ling et al. ...................... 716/7 |
| 6,288,447 B1 | | 9/2001 | Amishiro et al. ........... 257/758 |
| 2003/0088842 A1 | * | 5/2003 | Cirit ............................... 716/9 |
| 2004/0082230 A1 | * | 4/2004 | Jiao et al. .................... 439/894 |

OTHER PUBLICATIONS

Celik et al.,"An All–Purpose Transmission–Line Model for Interconnect Simulation in SPICE",Ocr 1997, IEEE Transactions on Microwave Theory and Techniques, vol. 45, iss. 10, pp. 1857–1867.*

Lee, "A Multilevel Parasitic Interconnect Capacitance Modeling and Extraction for Reliable VLSI On–Chip Clock Delay Evaluation", Apr. 1998, IEEE Journal of Solid–State Circuits, vol. 33, iss. 4, pp. 657–661.*

* cited by examiner

Primary Examiner—Vuthe Siek
Assistant Examiner—Sun James Lin
(74) Attorney, Agent, or Firm—Schmeiser, Olsen & Watts; Richard A. Henkler

(57) ABSTRACT

A method for designing integrated circuits comprising: partitioning interconnects of an integrated circuit design based on partition criteria to create sets of interconnect partitions; selecting at least one analysis method from a set of analysis methods to be performed on interconnects of each set of interconnect partitions; and performing each selected analysis method on interconnects of each corresponding interconnect partition.

20 Claims, 6 Drawing Sheets

METHOD AND SYSTEM FOR INTEGRATED CIRCUIT DESIGN

BACKGROUND OF INVENTION

Field of the Invention

The present invention relates to the field of integrated circuit design; more specifically, it relates to a method and system for an interconnect-driven integrated circuit design methodology.

Integrated circuit design has increasingly become more complex as customer requirements have not only trended to larger and physically more complex integrated circuits but also trended towards integrated circuits having a wide range of clock and signal frequencies, circuit types, power requirements and loads on the same integrated circuit. Analyzing such complex integrated circuits during integrated design to verify that the design will function to specification presents an ongoing problem as modeling techniques become more complex and calculation intensive.

SUMMARY OF INVENTION

A first aspect of the present invention is a method for designing integrated circuits comprising: partitioning interconnects of an integrated circuit design based on partition criteria to create sets of interconnect partitions; selecting at least one analysis method from a set of analysis methods to be performed on interconnects of each set of interconnect partitions; and performing each selected analysis method on interconnects of each corresponding interconnect partition.

A second aspect of the present invention is a system for designing integrated circuits comprising: means for partitioning interconnects of an integrated circuit design based on partition criteria to create sets of interconnect partitions; means for selecting at least one analysis method from a set of analysis methods to be performed on interconnects of each set of interconnect partitions; and means for performing each selected analysis method on interconnects of each corresponding interconnect partition.

A third aspect of the present invention is a program storage device readable by machine, tangibly embodying a program of instructions executable by the machine to perform method steps for designing an integrated circuit, the method steps comprising: partitioning interconnects of an integrated circuit design based on partition criteria to create sets of interconnect partitions; selecting at least one analysis method from a set of analysis methods to be performed on interconnects of each set of interconnect partitions; and performing each selected analysis method on interconnects of each corresponding interconnect partition.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

For the purposes of the present invention, the terms integrated circuit and integrated circuit design are used interchangeably. The term functional circuit is defined as a portion of an integrated circuit that performs a high-level specific function. Such functional circuits may be custom designed or pre-designed and stored in a design library. Functional circuits stored in libraries are also called cores. Functional circuits are assembled along with lower-level support circuits into the floor plan of an integrated circuit design. For example, an integrated circuit receiver may include a pseudo random binary sequence (PRBS) functional circuit or core, a de-multiplexer (DEMUX) functional circuit or core, an automatic gain control (AGC) functional circuit or core and a clock and data recovery (CDR) functional circuit or core besides support circuits.

Figure 1:
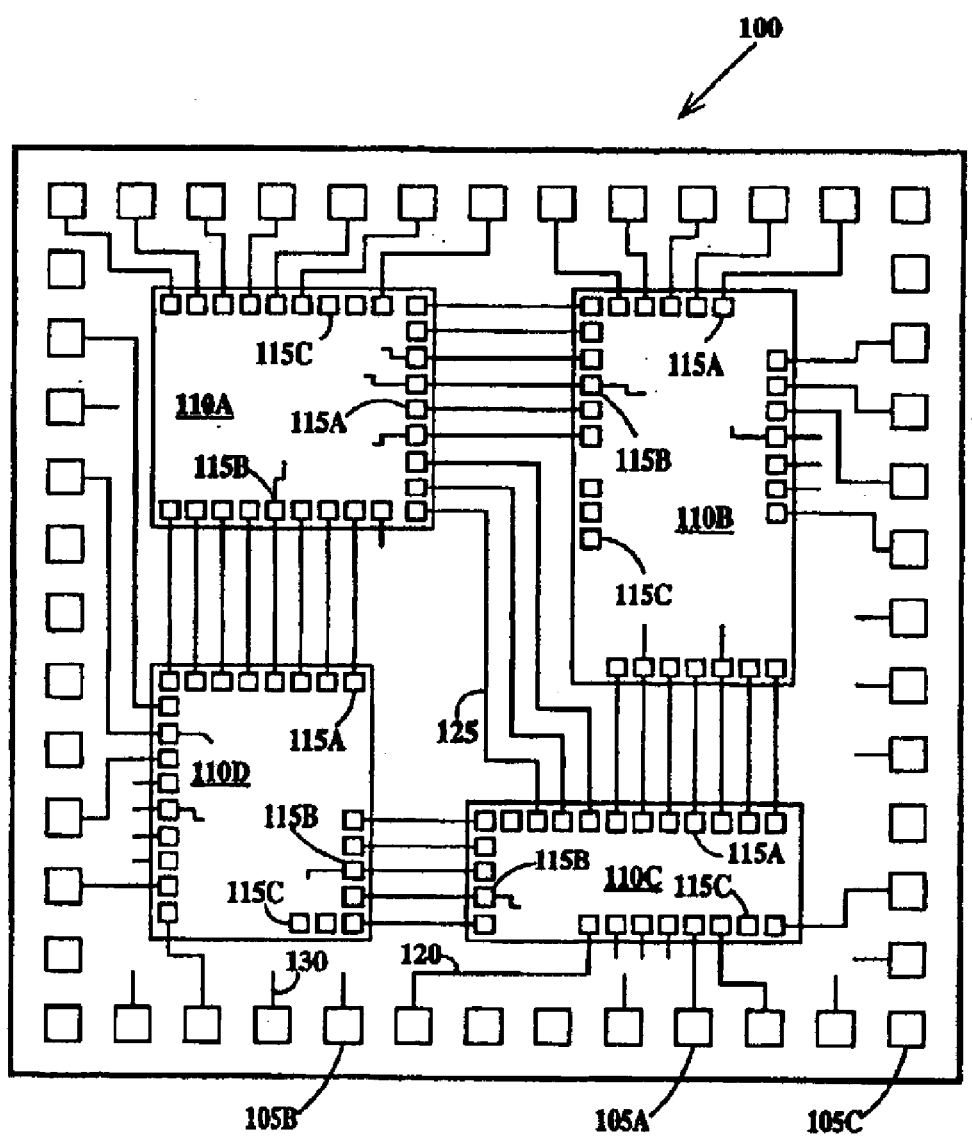
FIG. 1 is a schematic diagram of an exemplary integrated circuit design.

FIG. 1 is a schematic diagram of an exemplary integrated circuit design. In FIG. 1, integrated circuit 100 includes up to three types of input/outputs (I/Os), 105A 105B and 105C and, in the present example, four functional circuits 110A, 110B, 110C and 110D. Each functional circuit 110A, 110B, 110C and 110D includes up to three types of ports 115A, 115B and 115C. I/Os 705A are coupled to ports 115A or 115B in integrated circuits 110A, 110B, 110C or 110D by interconnects 120. I/Os 105B are coupled to support circuits (not illustrated) located between functional circuits 110A, 110B, 110C and 110D by interconnects 130. I/Os 105C are not used. Ports 115A on any given functional circuit 110A, 110B, 110C or 110D are coupled to I/Os 105A by interconnects 120 as stated Supra, or to ports 115A or 115B on other functional circuits by interconnects 125. Ports 115C are not used. For ports 115B, the interconnection is treated as extending to wiring within the functional circuit. For ports 115A, the interconnect terminates at the port.

The interconnection scheme between I/Os, ports, functional circuits and support circuits illustrated in FIG. 1 is kept simple in order to aid in presenting the current invention. Much more complex interconnections schemes that include, for example, a single I/O coupled to more than one functional circuit or a single port on a given functional circuit coupled to ports on two or more other functional circuits or to both a port and an I/O are possible. The present invention is therefore, not limited to the specific interconnection scheme illustrated in FIG. 1 and described supra.

A physical interconnection is generally comprised of wire segments joined on a single wiring level or by conductive vias extending between wire segments of the same interconnection fabricated on different wiring levels of a physical integrated circuit. Interconnections are expressed in an integrated circuit design in two inter-convertible ways. The first is a netlist indicating, among other parameters, the nodes a given interconnection joins. The second is a shapes file, which contains, among other parameters, the physical description of each interconnect by wire segment and via, i.e. height, width, length. The performance of an interconnect is measured as signal propagation delay.

Figure 2:
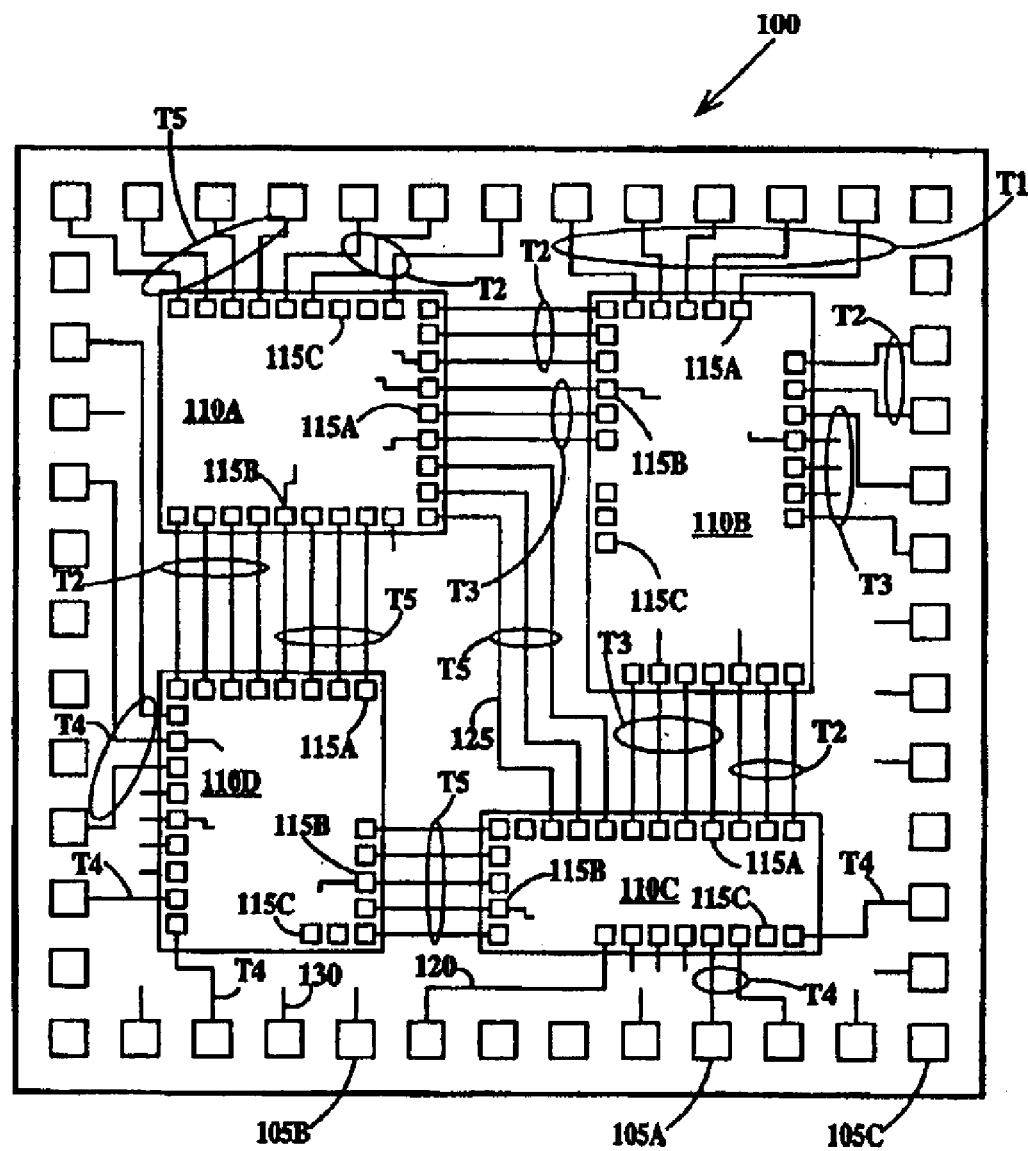
FIG. 2 is a schematic diagram of the integrated circuit design of FIG. 1 after tagging interconnects according to the present invention.

FIG. 2 is a schematic diagram of the integrated circuit design of FIG. 1 after tagging interconnects according to the present invention. In FIG. 2, each interconnect 120 and 125 is tagged with a different tag T1, T2, T3, T4 or T5 that will be used to partition the integrated circuit into a plurality of corresponding partitions (see FIGS. 3 and 4), each partition to be modeled with a different modeling tool. Only five tag types (T1, T2, T3, T4 and T5) are illustrated in FIG. 2, but any number of tags may be used in the practice of the present invention. While no interconnects 130 are tagged in FIG. 2, the tagging and thus inclusion of some or all of interconnects 130 in corresponding partitions is not excluded. Also not every connected port in a functional circuit is tagged. For example, some ports in functional circuits 110C and 110D are not tagged. Non-tagging of connected I/Os and ports is discussed in more detail infra.

Which tag is applied to which interconnect 120, 125 or 130 is based upon a set of partition criteria. Partition criteria may be divided into sub-criteria. There will be a tag for each partition sub-criteria (or partition criteria if there are no corresponding sub-criteria). Tags may be unique, or the same tag may be applied to more than one partition criteria or sub-criteria.

Examples of rules that partition criteria may be based on are (1) frequency of the signal carried by the interconnect, (2) the type of logic/signal carried by the interconnect, (3) the impedance loading of the interconnect, i.e. resistance-inductance-capacitance (RLC), and (4) the power carried by the interconnect. Power includes criteria based on the voltage applied to, the current carried by, the product of voltage and current applied to or the current applied to and resistance of an interconnect. Sub-criteria for frequency, impedance and power are simply rules delineating ranges of values. For example, frequency sub-criteria may be a set of rules slating: sub-criteria-A includes frequencies above 60 GHz, sub-criteria B includes frequencies between 60 and 40 GHz, sub-criteria C includes frequencies between 40 and 10 GHz, and sub-criteria D includes frequencies less than 10 GHz. It should be noted that bit-rate In Gb/s may be substituted for frequency in GHz when interconnects are carrying digital signals. Examples of sub-criteria for logic/signal type include but are not limited to rules to determine if the interconnect is carrying an emitter coupled logic (ECL) signals, If the interconnect is carrying common mode logic (CML) signals, if the interconnect is carrying transistor-transistor logic (TTL or $T^2L$) signals, if the interconnect is carrying modulated radio frequency (RF) signals and if the interconnect is carrying raw RF signals.

A selected group of criteria and sub-criteria may be applied to any given integrated circuit and the designer is free to select which criteria to use. It is also possible that a given interconnect may fall into two criteria, in which case the designer may select one of the possible criteria, or rules may be implemented to select one of the possible criteria. The tag attached to a given interconnect is used in the present invention to select the type of analysis or modeling to be used to model the performance of that interconnect and is discussed infra with respect to FIG. 5.

Figure 3:
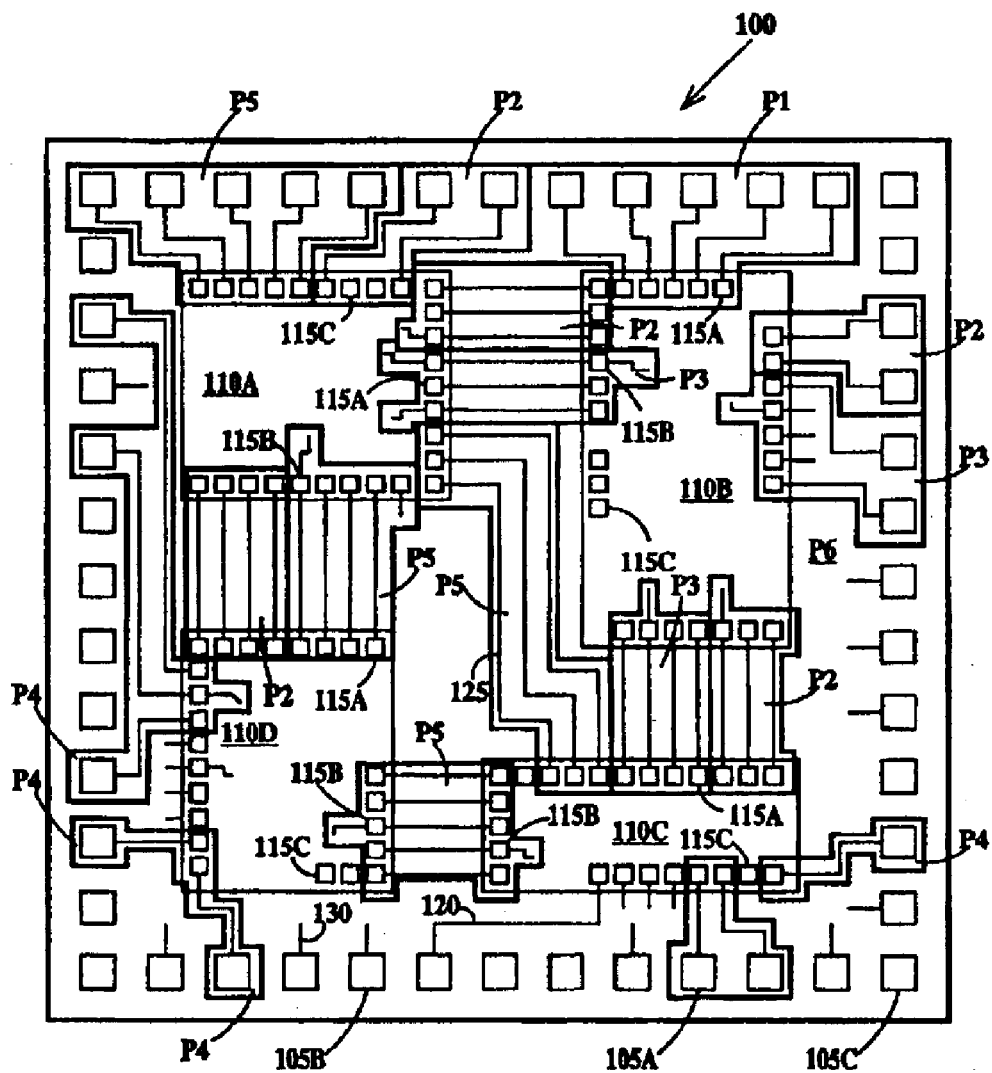
FIG. 3 is a schematic diagram of the integrated circuit design of FIG. 2 after partitioning according to the present invention.

FIG. 3 is a schematic diagram of the integrated circuit design of FIG. 2 after partitioning according to the present invention. In FIG. 3, partitions P1, P2, P3, P4 and P5(corresponding to tags T1, T2, T3, T4 and T5 of FIG. 2) are illustrated. A sixth partition P6 is also illustrated. Partition P6 includes all interconnects (connected I/Os and ports) not tagged in FIG. 2. Interconnects in partition P6 may be ignored in subsequent modeling or assigned one of tags T1, T2, T3, T4 and T5. The purpose of partition P6 is to ensure every interconnect is accounted for, even if it falls outside of the partition criteria or there is no need to model that interconnect. Partition P6 allows special cases to be handled by the methodology of the present invention. Interconnects in partition P6 may carry no tag or be assigned an arbitrary tag such T0 or T6 or assigned one of tags T1, T2, T3, T4 or T5. The exact method of handling partition P6 interconnects depends upon how the designer wants to handle partition P6 interconnects and the details of the software implementing the methodology of the present invention.

Figure 4:
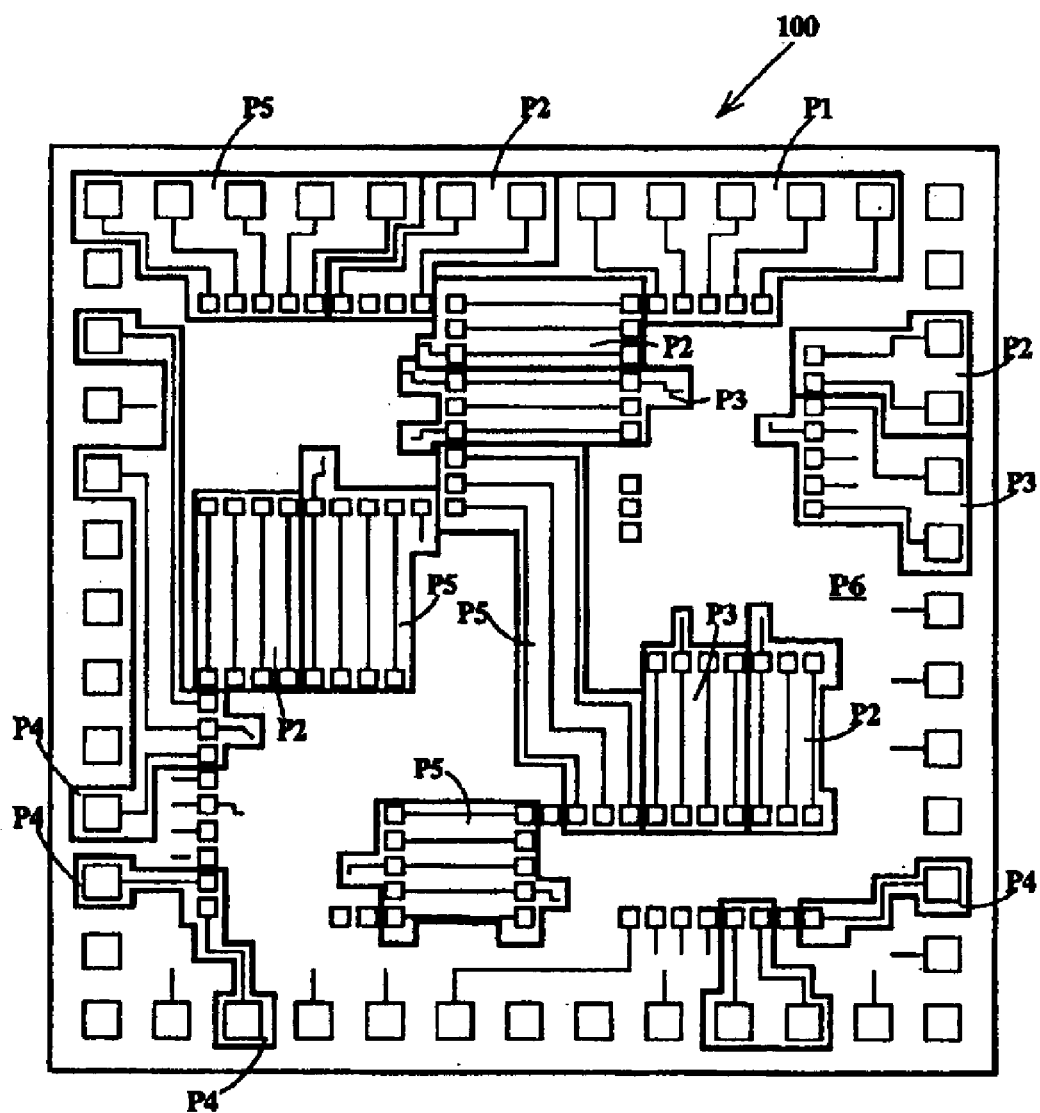
FIG. 4 is a schematic diagram of the integrated circuit design of FIG. 3 with functional circuit blocks removed for clarity.
Figure 5:
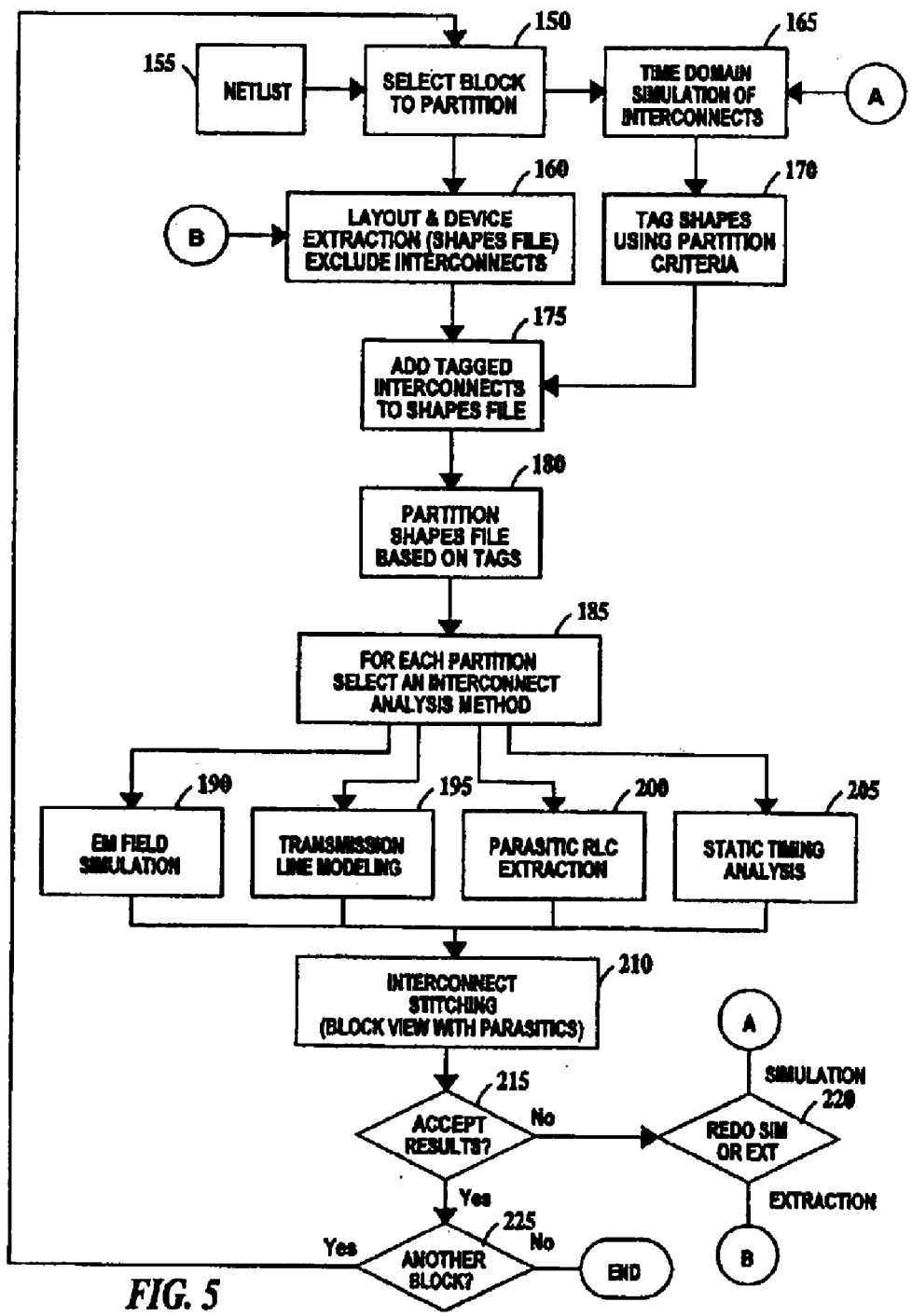
FIG. 5 is a flowchart of the method for an interconnect driven integrated circuit design methodology according to the present invention.

FIG. 4 is a schematic diagram of the integrated circuit design of FIG. 3 with functional circuit blocks removed for clarity. FIG. 4 is similar to FIG. 3, except that the outlines of functional circuits 110A, 110B, 110C and 110D are removed to make the following points. First, the partitions do not have a one to one correspondence to functional circuits or support circuits. Second, a given partition needs not be contiguous as functional circuits often are. Third, the same performance model is applied to each block having the same partition designation FIG. 5 is a flowchart of the method for an interconnect-driven integrated circuit design methodology according to the present invention. In step 150, a block to partition is selected from netlist 155. In step 150, a schematic of the selected block is captured. A block may be an entire integrated circuit, a portion of an integrated circuit (for example, one quarter of the integrated circuit or a geometric region superimposed over the integrated circuit floor plan), a functional circuit or a group of functional circuits. The point of selecting blocks is to allow for modeling of selected interconnects or to break up very large integrated circuits into smaller units for modeling.

In step 160, layout view (a shapes file) and device view (a symbol file) are extracted from the captured schematic of the block selected in step 150. Interconnects are excluded. Simultaneously with step 160, steps 165 and 170 are performed. In step 165, a shapes file of interconnects is extracted and time and frequency domain simulations of interconnects in the selected block are performed. Time domain simulation measures the performance of a circuit by analyzing power, voltage and current variations as a function of time. Frequency domain simulation measures the performance of a circuit by analyzing power, voltage and current variations as a function of frequency. Time (including logic) and frequency domain simulation results are used select the tags related to frequency, impedance and power in step 170. In step 170, tags are applied to interconnect shapes using partition criteria discussed supra.

In step 175, the results of steps 160 and 170 are merged. The tagged interconnect shapes file is merged with the shapes file from step 160. In step 180, the shapes file is partitioned based upon the tags assigned to each interconnect. Step 180 generally results in multiple petitions so one of steps 190, 195, 200 or 205 must be repeated for each partition. In step 185, an interconnect analysis method is selected based on the partition though different partitions may use the same analysis method. There are four analysis methods described in steps 190, 195, 200 and 205 5, only one method is performed for each partition. Each method may require input from step 160 in terms of layout or device view information in addition to the tagged shapes file generated in step 175. The exact information required is a function of the analysis method chosen in step 185.

If the method corresponding to the current partition is electromagnetic (EM) field simulation then in step 190, EM field simulation is performed. EM field simulation takes into account signal delay on interconnects due to electromagnetic interaction of signals in a set of interconnects and requires solution of complex 3-dimensional full wave equations. An example of a partition that would use step 190 is a partition corresponding to very high frequency partition criteria.

If the method corresponding to the current partition is transmission line modeling then in step 195, transmission line modeling is performed. Transmission line modeling breaks up an interconnect into elements and models the delay in each element as an impedance, the sum of the delays being the delay of the interconnect. An example of a partition that would use step 195 is a partition corresponding to resistance and inductance partition criteria.

If the method corresponding to the current partition is parasitic RLC extraction then in step 200, parasitic RLC extraction is performed. Parasitic RLC extraction modeling is Parasitic RLC extraction modeling attributes delay in signal propagation to parasitic elements, namely resistors, inductors, capacitors attached to the interconnect and determines delay based calculation of the values or those parasitic elements. An example of a partition that would use step 200 is a partition corresponding to low frequency partition criteria.

If the method corresponding to the current partition is static timing analysis then in step 205, static timing analysis is performed. Static timing analysis determines tho delay in an interconnect based on driver circuit delays, intervening circuit delays, and receiving circuit delays and ignores interconnect delays. An example of a partition that would use step 205 is a partition corresponding to low frequency partition criteria.

Generally, step 190 is the most accurate, computer resource intensive and most time consuming of steps 190, 195, 200 and 205. Step 195 is less accurate, takes less computer resource and less time than step 190. Step 200 is less accurate, takes less computer resource and less time than step 195. Step 205 is the least accurate, takes the least amount of computer resource and the least amount of time of steps 190, 195, 200 and 205. While four interconnect analysis methods are illustrated, any number of additional analysis methods may be added. A significant advantage of the present invention is partitioning based on performance required can save a significant amount of time and computer resource while still providing the necessary degree of accuracy.

The results of the analysis performed in steps 185 through 205 are accumulated in step 210. Since the results are by partition, the results are stitched into an extracted view with all parasitics summarized by the layout of the selected block. For example, if the selected block is an integrated circuit, the extended view is sub-divided into views by functional circuit by port types and I/Os. Stitching is based on function.

In step 215, the designer decides whether the design is acceptable. If in step 215, the design is acceptable then in step 225, it is determined if another block must be analyzed. If there is another block to be analyzed then the method loops to step 150, otherwise the method ends. If in step 215, the designer decides the design is not acceptable, then in step 220 the designers decides whether to adjust and rerun the simulation of step 165 or modify the extractions of step 160. If in step 220, the designer decides to adjust and rerun the simulation then the method loops to step 165. If in step 220, the designer decides to modify the extractions then the method loops to step 160.

Figure 6:
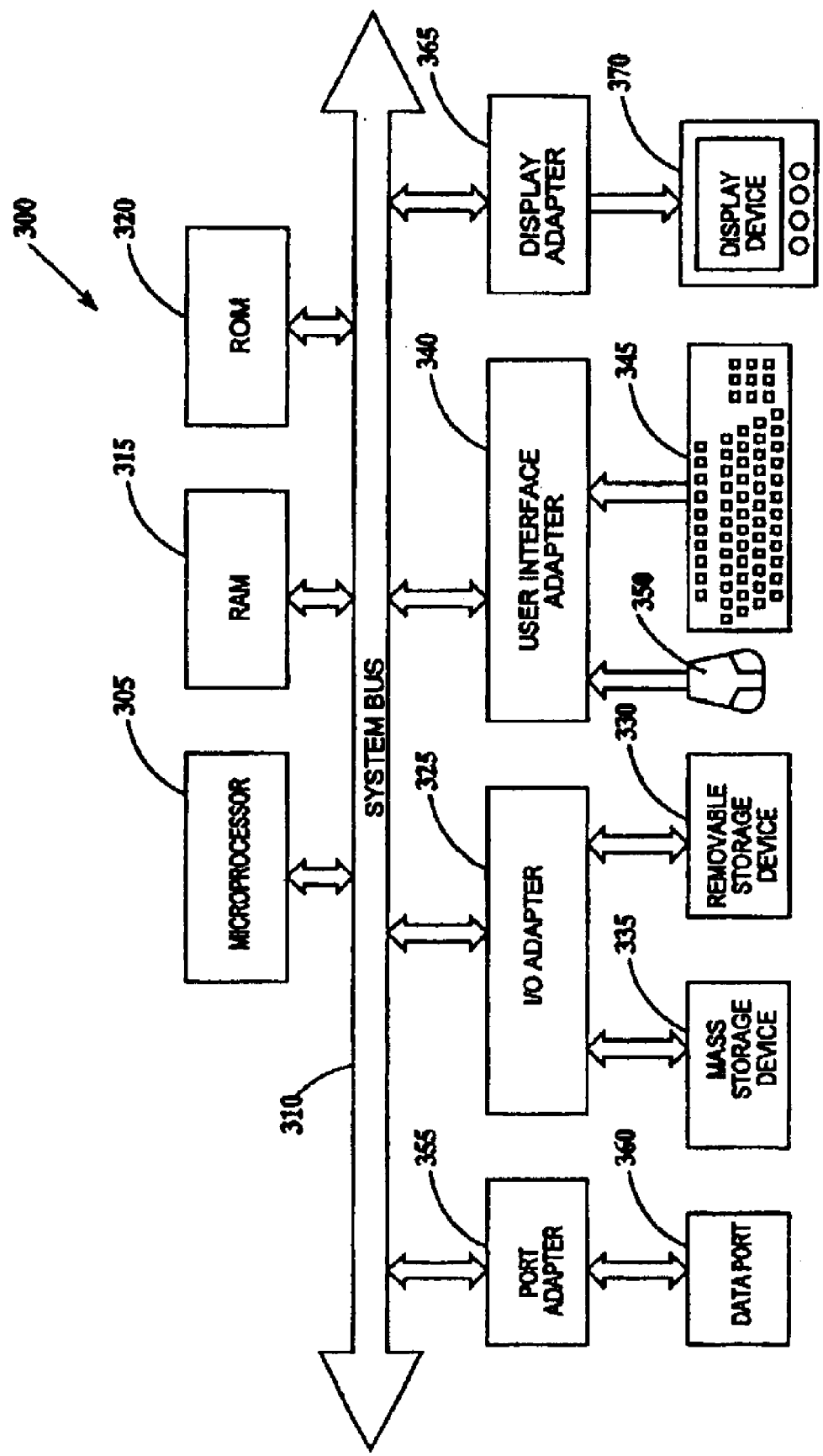
FIG. 6 is a schematic block diagram of a general-purpose computer for practicing the present invention.

Generally, the method described herein with respect to interconnect-driven integrated circuit design is practiced with a general-purpose computer and the method may be coded as a set of instructions on removable or hard media for use by the general-purpose computer. FIG. 6 is a schematic block diagram of a general-purpose computer for practicing the present invention. In FIG. 6, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD ROM drives. Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for designing integrated circuits comprising:
   partitioning interconnects of an integrated circuit design based on partition criteria to create sets of interconnect partitions;
   selecting at least one analysis method from a set of analysis methods to be performed on interconnects of each set of interconnect partitions;
   performing each selected analysis method on interconnects of each corresponding interconnect partition; and
   stitching the results of each analysis of each of said sets of interconnect partitions and presenting a combined view of said analysis results.

2. The method of claim 1, wherein said combined view is presented by functional circuits ports and integrated circuit I/Os.

3. The method of claim 1, wherein said partition criteria are selected from the group of criteria consisting of rules based on a frequency of the signal carried by each interconnect, rules based on a type of logic/signal carried by each interconnect, rules based on an impedance loading of each interconnect and rules based on power carried by each interconnect.

4. The method of claim 3, wherein;
said rules based on a frequency of the signal carried by each interconnect include sub-rules based on ranges of frequency;
said rules based on an impedance loading or each interconnect include sub-rules based on ranges of impedance; and
said rules based on power carried by each interconnect include sub-rules based on ranges of power.

5. The method of claim 1, wherein said analysis methods are each selected from the group consisting of electromagnetic field simulation, transmission line modeling, parasitic RLC extraction, and static timing analysis.

6. The method of claim 1, further including tagging each interconnect with a tag indicating which set of interconnect partition each interconnect is a member of.

7. The method of claim 1, further including extracting from a netlist describing said integrated circuit, information for interconnects in each set of interconnect partitions required by said selected analysis method.

8. The method of claim 1, wherein said integrated circuit comprises a plurality of functional circuits having ports, said interconnects coupling ports of a given functional circuit to ports of another functional circuit, to support circuits in said integrated circuit, or to I/Os of said integrated circuits.

9. A system for designing integrated circuits comprising:
means for partitioning interconnects of an integrated circuit design based on partition criteria to create sets of interconnect partitions;
means for selecting at least one analysis method from a set of analysis methods to be performed on interconnect partitions;
means for performing each selected analysis method on interconnects of each corresponding interconnect partition; and
means for stitching the result of each analysis of each of said sets of interconnects partitions and presenting a combined view of said analysis results.

10. The system of claim 9, wherein said combined view is presented by functional circuits ports and integrated circuit I/Os.

11. The system of claim 9, wherein said partition criteria are selected from the group of criteria consisting of rules based on a frequency of the signal carried by each interconnect, rules based on a type of logic/signal carried by each interconnect, rules based on an impedance loading of each interconnect and rules based on power carried by each interconnect.

12. The system of claim 11, wherein:
said rules based on a frequency of the signal carried by each interconnect include sub-rules based on ranges or frequency;
said rules based on an impedance loading of each interconnect include sub-rules based on ranges of impedance; and
said rules based on power carried by each interconnect include sub-rules based on ranges of power.

13. The system of claim 9, wherein said analysis methods are each selected from the group consisting of electromagnetic field simulation, transmission line modeling, parasitic RLC extraction, and static timing analysis.

14. The system of claim 9, further including means for tagging each interconnect with a tag indicating which set of interconnect partitions each interconnect is a member of.

15. The system of claim 9, further including means for extracting from a netlist describing said integrated circuit, information for interconnects in each set of interconnect partitions required by said selected analysis method.

16. The system of claim 9, wherein said integrated circuit comprises a plurality of functional circuits having ports, said interconnects coupling ports or a given functional circuit to ports of another functional circuit, to support circuits in said integrated circuit, or to I/Os of said integrated circuits.

17. A program storage device readable by machine, tangibly embodying a program of instructions executable by the machine to perform method steps for designing an integrated circuit, said method steps comprising:
partitioning interconnects of an integrated circuit design based on partition criteria to create sets of interconnect partitions;
selecting at least one analysis method from a set of analysis methods to be performed on interconnects of each act of interconnect partitions;
performing each selected analysis method on interconnects of each corresponding interconnect partition; and
stitching the results of each analysis of each of said sets of interconnect partitions and presenting a combined view of said analysis results.

18. The program storage device claim 17, wherein said partition criteria are selected from the group of criteria consisting of rules based on a frequency of the signal carried by each interconnect, rules based on a type of logic/signal carried by each interconnect, rules based on an impedance loading of each interconnect and rules based on power carried by each interconnect.

19. The method of claim 17, wherein said combined view is presented by functional circuits ports and integrated circuit I/Os.

20. The method of claim 17, further including tagging each interconnect with a tag indicating which sect of interconnect partitions each interconnect is a member of.

* * * * *